United States Patent
Yao et al.

(10) Patent No.: US 7,443,330 B2
(45) Date of Patent: Oct. 28, 2008

(54) METHOD OF 1-BIT HYSTERETIC CONTROL IN N-BIT A/D CONVERSION

(75) Inventors: Kaiwei Yao, Santa Clara, CA (US); Zhou Lu, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 186 days.

(21) Appl. No.: 11/450,106

(22) Filed: Jun. 8, 2006

(65) Prior Publication Data

US 2008/0068230 A1  Mar. 20, 2008

(51) Int. Cl.
*H03M 1/12* (2006.01)
(52) U.S. Cl. .............. 341/155; 341/118; 341/120; 341/158
(58) Field of Classification Search ............... 341/118, 341/120, 155, 158
See application file for complete search history.

(56) References Cited

U.S. PATENT DOCUMENTS

| | | | | |
|---|---|---|---|---|
| 4,309,767 A | * | 1/1982 | Andow et al. ............... | 714/735 |
| 4,721,944 A | * | 1/1988 | Kiikuniya et al. ........... | 341/158 |
| 4,736,189 A | * | 4/1988 | Katsumata et al. .......... | 341/120 |
| 4,926,351 A | * | 5/1990 | Wratil et al. ................. | 702/57 |
| 5,712,633 A | * | 1/1998 | Bae ............................. | 341/120 |
| 6,225,937 B1 | * | 5/2001 | Butler ......................... | 341/169 |
| 6,714,886 B2 | * | 3/2004 | Sung et al. .................. | 702/107 |
| 6,900,749 B2 | * | 5/2005 | Tani et al. ................... | 341/118 |
| 6,930,629 B1 | * | 8/2005 | Saito ........................... | 341/155 |
| 2002/0000928 A1 | * | 1/2002 | Heyl et al. .................. | 341/155 |
| 2003/0193425 A1 | * | 10/2003 | Chou .......................... | 341/162 |
| 2005/0104761 A1 | * | 5/2005 | Kumakura ................... | 341/155 |
| 2005/0184894 A1 | * | 8/2005 | Ando .......................... | 341/141 |
| 2008/0018517 A1 | * | 1/2008 | Yamada et al. .............. | 341/165 |

* cited by examiner

*Primary Examiner*—Linh V Nguyen
(74) *Attorney, Agent, or Firm*—Perkins Coie LLP; Zhou Lu

(57) ABSTRACT

The present invention introduces methods to eliminate 1-bit jitter problem in the N-bit A/D conversion applications. The methods do not require any increase in the total bit of A/D conversion.

11 Claims, 5 Drawing Sheets

METHOD OF 1-BIT HYSTERETIC CONTROL IN N-BIT A/D CONVERSION

TECHNICAL FIELD

The present invention relates to analog-to-digital converters.

BACKGROUND

FIG. 1 illustrates a block diagram of a basic N-bit analog-to-digital converter. The analog input signal is designated as Vin*. The input, along with a reference voltage $V_{ref}$, is used to determine the digital output that best represents the analog input signal. In the figure, a set of fixed reference levels Vi are applied to comparators whose outputs Xi are then decoded into an output digital signal. The A/D converter converts a continuous range of input amplitude levels into a discrete set of digital signals. FIG. 2 illustrates an ideal input-output characteristic for a 3-bit A/D converter.

However, there is 1-bit jitter or oscillation in the output signal when the analog input signal has noise and/or the digital signal is on the edge of an increasing or decreasing bit. It is difficult to remove this oscillation without sacrificing the conversion resolution or increasing the total number of bits of the output digital signal.

BRIEF DESCRIPTION OF THE DRAWINGS

The foregoing aspects and many of the advantages of the invention will become more readily appreciated by reference to the following detailed description, when taken in conjunction with the accompanying drawings, wherein.

DETAILED DESCRIPTION

The present invention relates to methods for converting an analog signal to a digital signal. The proposed methods can eliminate the 1-bit oscillation problem without increasing the total bits of A/D conversion.

In the following description, several specific details are presented to provide a thorough understanding of the embodiments of the invention. One skilled in the relevant art will recognize, however, that the invention can be practiced without one or more of the specific details, or in combination with or with other components, etc. In other instances, well-known implementations or operations are not shown or described in detail to avoid obscuring aspects of various embodiments of the invention.

Reference throughout the specification to "one embodiment" means that a particular feature, structure, implementation, or characteristic described in connection with the embodiment is included in at least one embodiment of the present invention. Thus, uses of the phrases "in one embodiment" in various places throughout the specification are not necessarily all referring to the same embodiment. Furthermore, the particular features, structures, implementation, or characteristics may be combined in any suitable manner in one or more embodiments.

Figure 1:
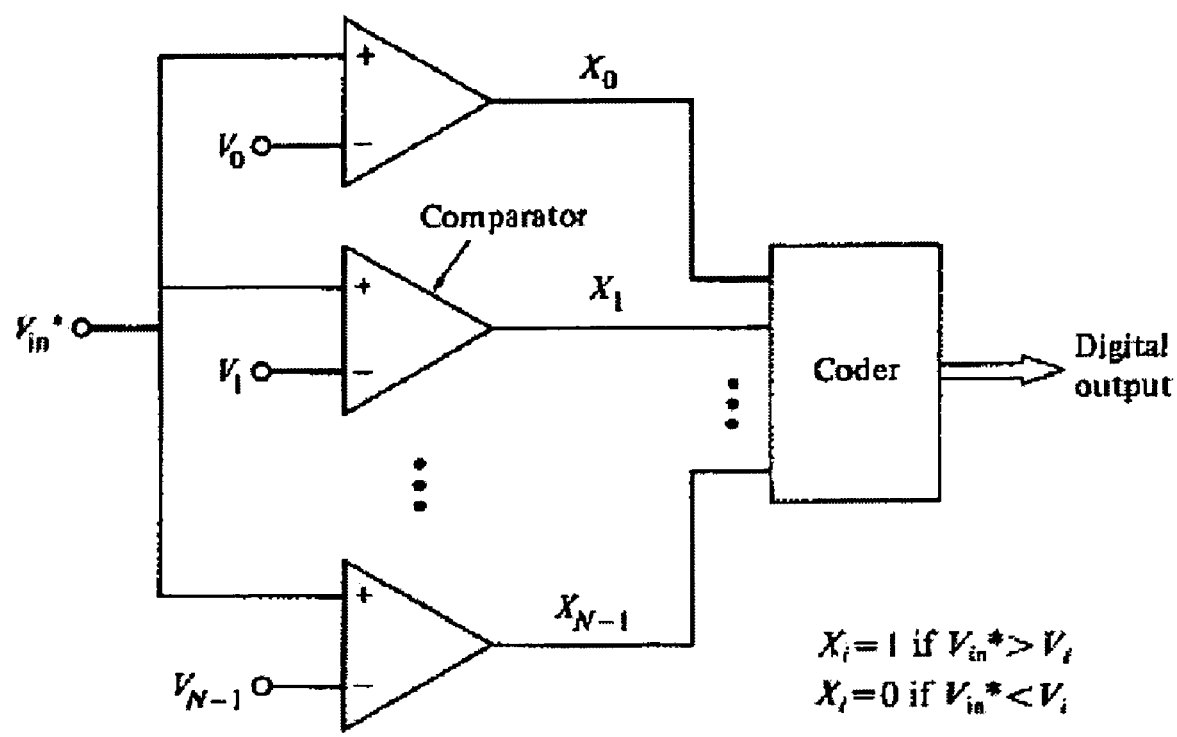
FIG. 1 is a prior art block diagram of a basic 8 bit analog-to-digital converter.
Figure 2:
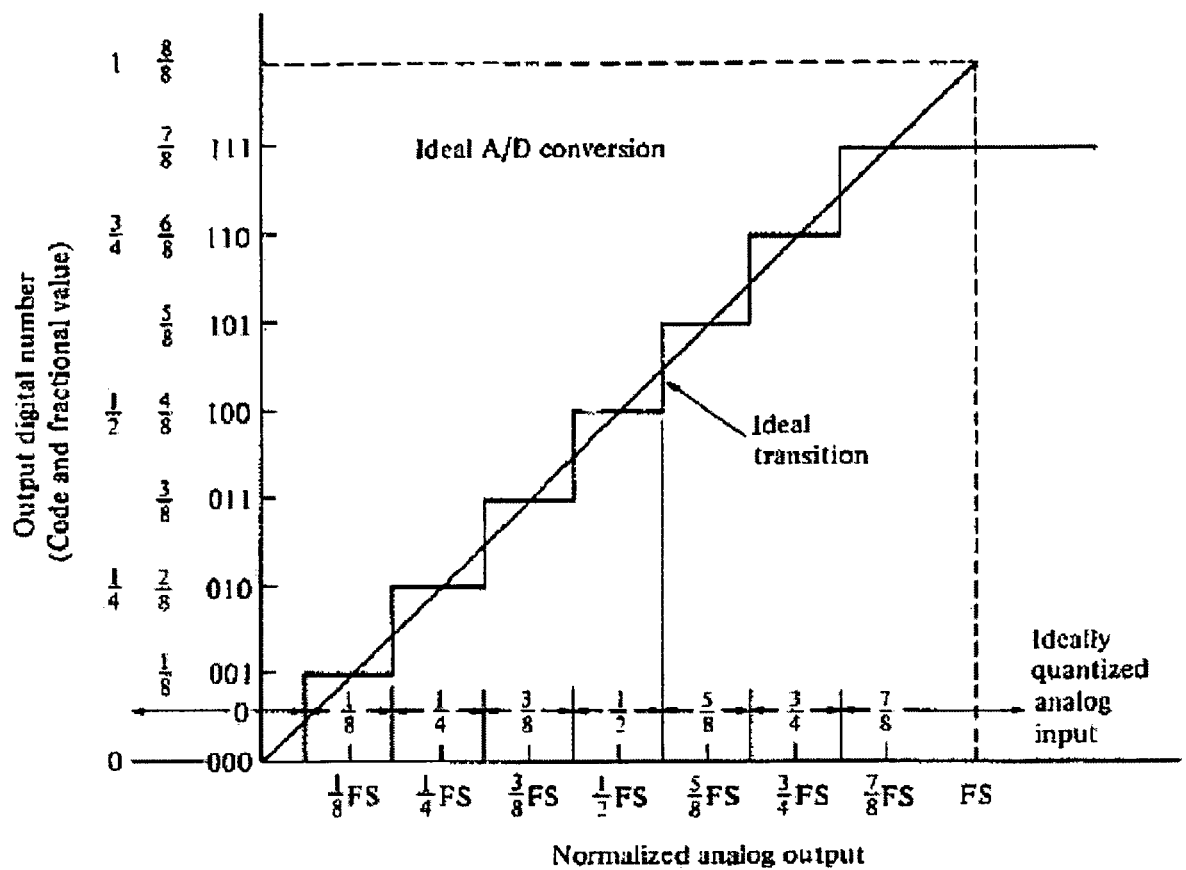
FIG. 2 illustrates an ideal input-output characteristic for a 3-bit A/D converter.
Figure 3:
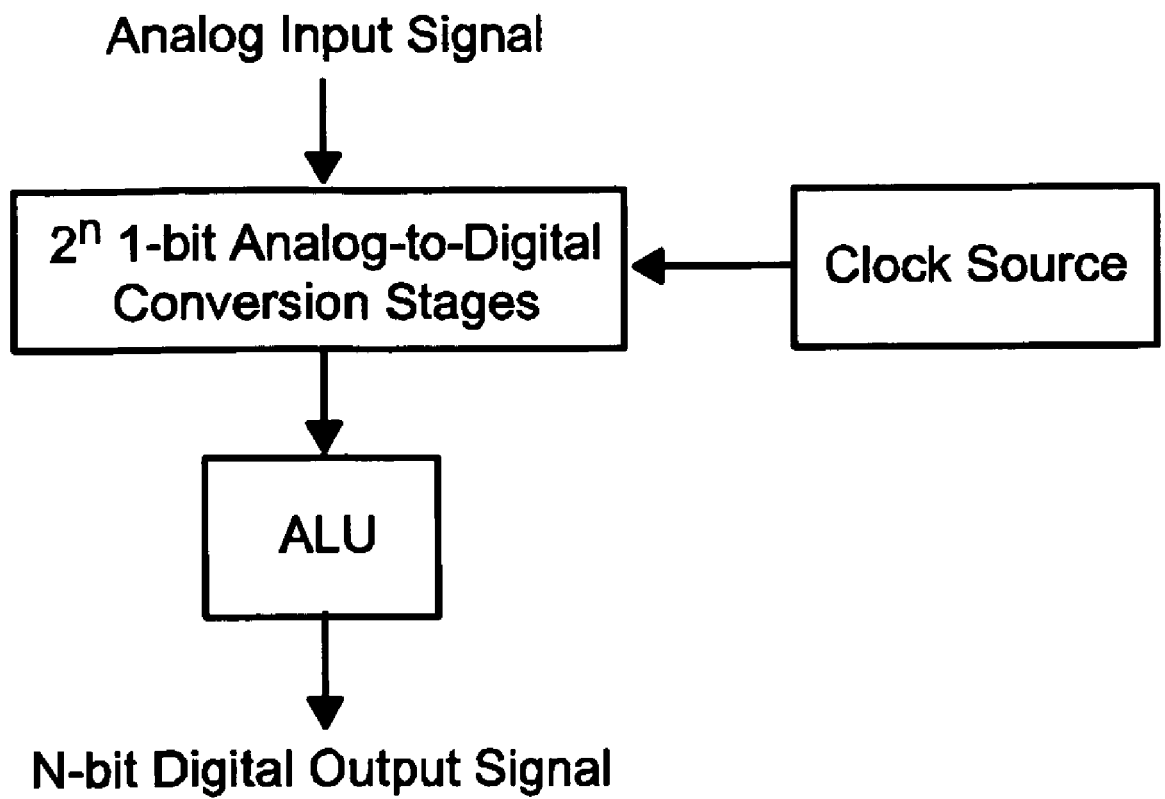
FIG. 3 is a block diagram of an N-bit A/D converter.

In one embodiment of the present invention, an N-bit analog-to-digital (A/D) converter comprises $2^N$ 1-bit analog-to-digital conversion stages, and an arithmetic logic unit (ALU) that includes a 1-bit storage unit, is_inc. The N-bit A/D converter is illustrated in FIG. 3. An analog input signal is sampled and converted to a new N-bit digital signal through the $2^N$ 1-bit analog-to-digital conversion stages. The new N-bit digital signal is compared with a previously selected N-bit digital output signal through the ALU. If the new N-bit digital signal is larger than the previous selected N-bit digital output signal, a "1" is recorded in the 1-bit storage unit, is_inc; otherwise, a "0" is recorded in the 1-bit storage unit.

If the new N-bit digital signal is larger than the previous selected N-bit digital output signal, the new N-bit digital signal is selected as a new digital output signal. If the new N-bit digital signal decreases more than 1 bit from the previous selection, the new N-bit digital signal is selected as a new digital output signal. If the new N-bit digital signal decreases 1 bit from the previously selected N-bit digital output signal and is_inc is equal to "0", the new N-bit digital signal is selected as a new digital output signal. In all other cases, the previous selected N-bit digital output signal is maintained as the new digital output signal.

Figure 4:
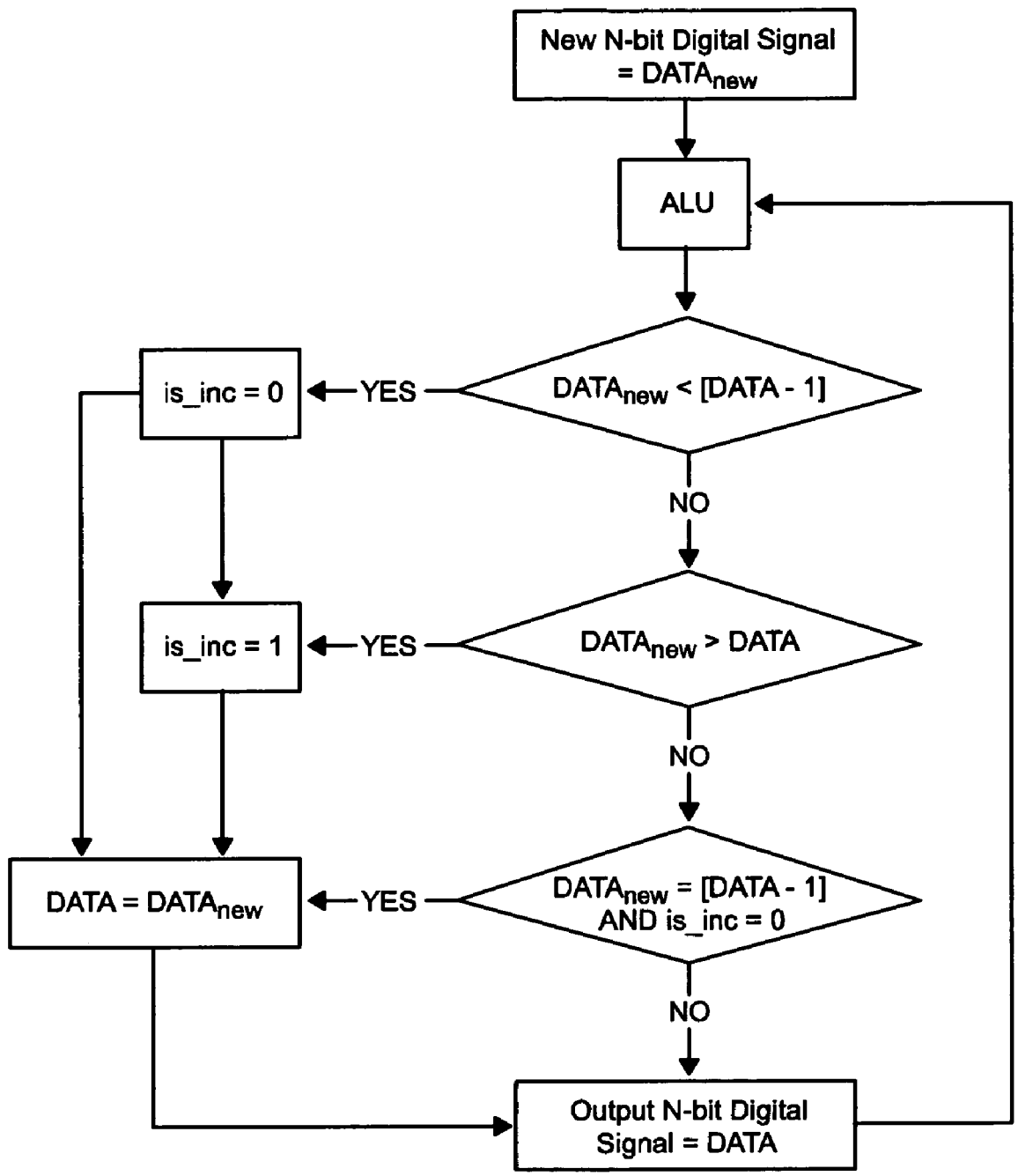
FIG. 4 illustrates an embodiment of the present invention.

This method can effectively eliminate the 1-bit oscillation problem. FIG. 4 illustrates in flowchart form the above method and is also expressed in pseudo-code as follows:

```
if (DATAnew < [DATA−1]) then DATA = DATAnew; is_inc=0;
else if (DATAnew > DATA) then DATA = DATAnew; is_inc=1;
else if (DATAnew = [DATA−1]) and (~is_inc) then DATA = DATAnew;
```

A different approach can also be taken and is also effective. An analog input signal is sampled and converted to a new N-bit digital signal through the $2^N$ 1-bit analog-to-digital conversion stages. The new N-bit digital signal is compared with the previously selected N-bit digital output signal through the ALU. If the new N-bit digital signal is larger than the previously selected N-bit digital output signal, a "1" is recorded in the 1-bit storage unit, is_inc; otherwise, "0" is recorded in the 1-bit storage unit.

If the new N-bit digital signal is smaller than the previous selected N-bit digital output signal, select the new N-bit digital signal as a new digital output signal. If the new N-bit digital signal increases more than 1 bit from the previous selected N-bit digital output signal, select the new N-bit digital signal as a new digital output signal. If the new N-bit digital signal increases 1 bit from the previous selected N-bit digital output signal and is_inc is equal to "1", select the new N-bit digital signal as a new digital output signal. In all other cases, select the previous selected N-bit digital output signal as a new digital output signal.

In another embodiment of the present invention, an N-bit analog-to-digital converter comprises $2^N$ 1-bit analog-to-digital conversion stages, and an arithmetic logic unit (ALU) that includes an M-bit storage unit, wherein M is larger than or equals to $(N+\log_2 K)$. The M-bit storage unit is used to record the sum of K N-bit digital signals.

When any new digital signal is sampled, a new sum of the last K N-bit digital signals sampled and converted from the analog input signals is calculated and compared with the old sum value that is stored in the M-bit storage unit.

If the difference is larger than K-1, the old sum value is updated with the new sum value, and the new sum value is recorded in the M-bit storage unit. When the difference is less than or equal to K-1, the old sum value is maintained. Finally, an N-bit digital signal is selected as a new digital output signal that is equal to the ratio of the sum value in the M-bit storage unit over K.

Figure 5:
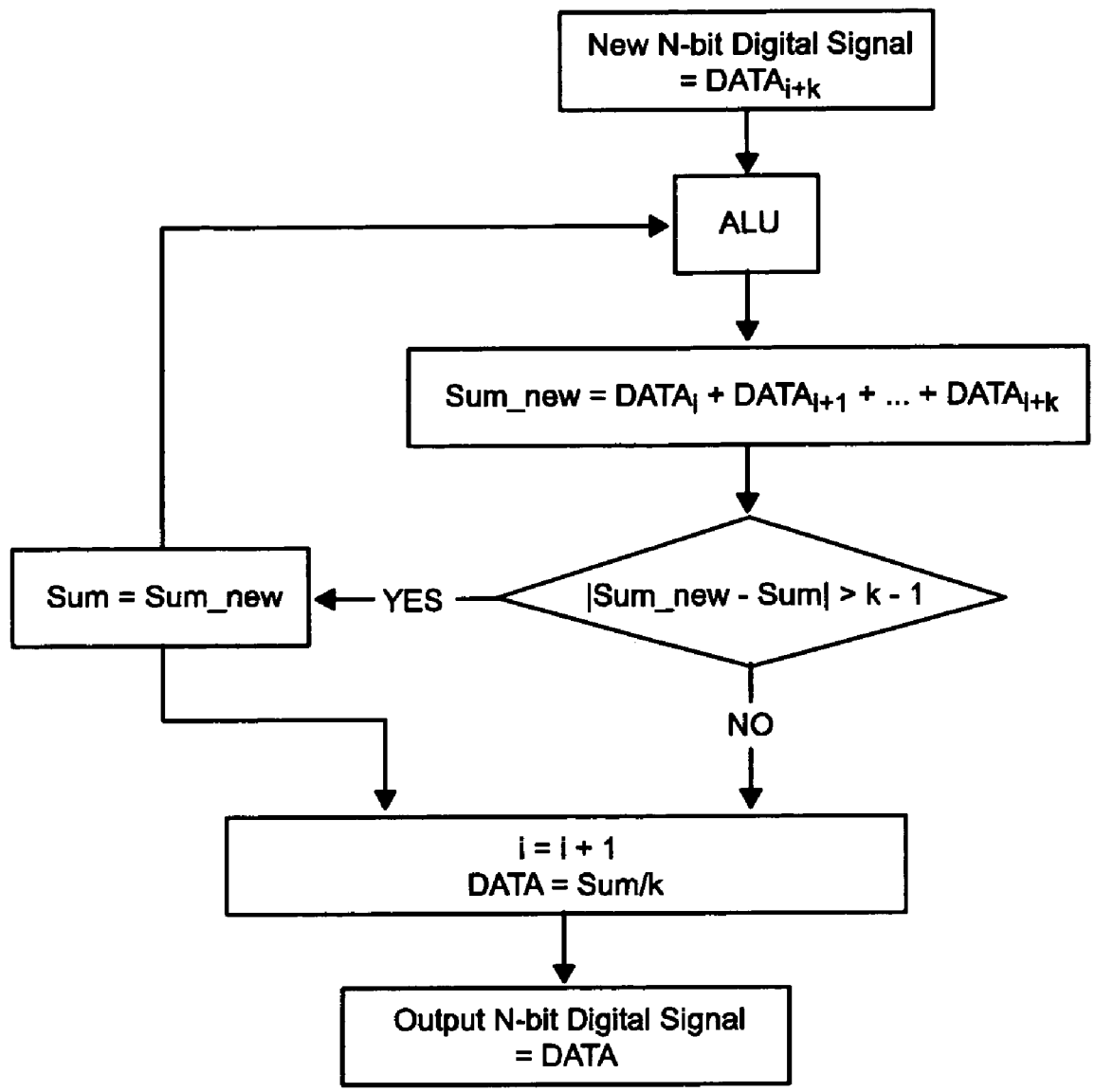
FIG. 5 illustrates another embodiment of the present invention.

The method can also effectively eliminate the 1-bit oscillation problem in the N-bit A/D converter. Its flowchart is shown in FIG. 5 and also can be expressed in pseudo-code as follows:

---

Sum_new= $DATA_i+DATA_{i+1}+\ldots+DATA_{i+K}$; where $DATA_{i\ to\ i+K}$ are the latest K
    data words.
If (|Sum_new−Sum|>K−1 then Sum=Sum_new;
i=i+1;
DATA=Sum/K;

---

In the present invention, different methods are taken to eliminate the 1-bit jitter/oscillation problem in N-bit analog-to-digital applications. In one embodiment of the present invention, a new N-bit digital signal sampled and converted from the input analog signal is compared with the previously selected N-bit digital output signal. The difference between the new N-bit digital signal and the previously selected N-bit digital output signal, together with the trend of output digital signals, are used to determine whether to select the new N-bit digital signal or the previously selected output signal as a new digital output signal.

In another embodiment of the present invention, a new sum of the last K N-bit digital signals sampled and converted from the analog input signals is calculated when any new digital signal is sampled. The new sum value is compared with the old sum value that is stored in an M-bit storage unit, wherein M is larger than or equals to $(N+\log_2 K)$. If the difference between the new sum value and the old sum value satisfies a predetermined condition, update the old sum value with the new sum value and record the new sum value in the M-bit storage unit. If the difference is less than or equal to the predetermined value, keep the old sum value in the M-bit storage unit. Then, derive a new N-bit digital signal that is equal to the ratio of the sum value in the M-bit storage unit over K, and select the new N-bit digital signal as a new digital output signal. The methods with the present invention can effectively eliminate the 1-bit jitter/oscillation in N-bit analog-to-digital (A/D) applications.

The preferred and several alternate embodiments have thus been described. After reading the foregoing specification, one of ordinary skill will be able to effect various changes, alterations, combinations, and substitutions of equivalents without departing from the broad concepts disclosed. It is therefore intended that the scope of the letters patent granted hereon be limited only by the definitions contained in the appended claims and equivalents thereof, and not by limitations of the embodiments described herein.

We claim:

1. A method for translating an analog signal to a digital signal, comprising:

sampling said analog signal from an input terminal;
converting said analog signal to an N-bit digital signal;
comparing said N-bit digital signal with a previously selected N-bit digital signal, and recording "X" in said 1-bit storage unit when said N-bit digital signal is larger than said previously selected N-bit digital signal, recording "Y" in said 1-bit storage unit when said N-bit digital signal is less than or equal to said previously selected N-bit digital signal, wherein "X" and "Y" are digital numbers; and
selecting said previously selected N-bit digital signal if said N-bit digital signal is 1-bit smaller than previously selected N-bit digital signal and said 1-bit storage unit contains "X", and selecting said N-bit digital signal in all other cases.

2. The method in claim 1, wherein X is 1 and Y is 0.
3. The method in claim 1, wherein X is 1 and Y is 1.
4. A method for translating an analog signal to a digital signal, comprising:

sampling said analog signal from an input terminal;
converting said analog signal to an N-bit digital signal;
comparing said N-bit digital signal with a previously selected N-bit digital signal, and recording "X" in said 1-bit storage unit when said N-bit digital signal is larger than said previously selected N-bit digital signal, recording "Y" in said 1-bit storage unit when said N-bit digital signal is less than or equal to said previously selected N-bit digital signal; and
selecting said previously selected N-bit digital signal if said N-bit digital signal is 1-bit larger than said previously selected N-bit digital signal and said 1-bit storage unit has "Y", and selecting said N-bit digital signal in all other cases.

5. The method in claim 4, wherein X is 1 and Y is 0.
6. The method in claim 4, wherein X is 0 and Y is 1.
7. A method for translating an analog signal to a digital signal, comprising:

sampling said analog signal from an input terminal;
converting said analog signal to an N-bit digital signal;
comparing the sum of the last K N-bit digital signals sampled and converted from said analog signal with a second digital signal that is stored in a M-bit storage unit, wherein M is greater than or equal to $(N+\log_2 K)$;
deriving the difference between said sum of the last K N-bit digital signals and said second digital signal stored in said M-bit storage unit;
recording said sum in said M-bit storage unit if said difference is larger than a predetermined value, and keeping said second digital signal in said M-bit storage unit if said difference is smaller than or equal to the predetermined value;
dividing the digital data stored in said M-bit storage unit by K and deriving a new N-bit digital signal; and
selecting said new N-bit digital signal.

8. An analog-to-digital conversion apparatus, comprising:
$2^N$ 1-bit analog-to-digital conversion stages operable to convert an analog signal into an N-bit signal; and
an arithmetic logic unit (ALU) further comprising a one-bit storage unit, electrically coupled to said 2N 1-bit analog-to-digital conversion stages. said ALU operable to perform the following functions:
comparing said N-bit digital signal with a previously selected N-bit digital signal and recording an "X" in said one-bit storage unit when said N-bit digital signal is greater than said previously selected N-bit digital signal.
recording a "Y" in said one-bit storage unit when said N-bit digital signal is less than or equal to said previously selected N-bit digital signal, wherein "X" and "Y" are digital numbers,
selecting said previously selected N-bit digital signal if said N-bit digital signal is one-bit smaller than said previously selected N-bit digital signal and said one-bit storage unit contains "X", and
selecting said N-bit digital signal in all other cases.

9. An analog-to-digital conversion apparatus, comprising:
2N 1-bit analog-to-digital conversion stages;
an arithmetic logic unit (ALU) further comprising an M-bit storage unit wherein M is larger than or equal to $(N+\log_2 K)$, wherein said ALU is operable to perform the following functions:

comparing the sum of the last K N-bit digital signals sampled and converted from said analog signal with a second digital signal that is stored in a M-bit storage unit, wherein M is greater than or equal to $(N+\log_2 K)$;

deriving the difference between said sum of the last K N-bit digital signals and said second digital signal stored in said M-bit storage unit;

recording said sum in said M-bit storage unit if said difference is larger than a predetermined value, and keeping said second digital signal in said M-bit storage unit if said difference is less than or equal to the predetermined value;

dividing the digital data stored in said M-bit storage unit by K and deriving a new N-bit digital signal; and selecting said new N-bit digital signal.

10. The analog-to-digital conversion apparatus of claim 8 further comprising a clock source electrically coupled to said ALU.

11. The analog-to-digital conversion apparatus of claim 9 further comprising a clock source electrically coupled to said ALU.

* * * * *